US011972962B2

(12) United States Patent
Pan

(10) Patent No.: US 11,972,962 B2
(45) Date of Patent: Apr. 30, 2024

(54) ADJUSTABLE DEVICE AND AN ADJUSTABLE STORAGE BOX

(71) Applicant: DLY TECHNOLOGIES INC., Kaohsiung (TW)

(72) Inventor: Shih Feng Pan, Donggang Township (TW)

(73) Assignee: DLY TECHNOLOGIES INC., Kaohsiung (TW)

( * ) Notice: Subject to any disclaimer, the term of this patent is extended or adjusted under 35 U.S.C. 154(b) by 359 days.

(21) Appl. No.: 17/398,685

(22) Filed: Aug. 10, 2021

(65) Prior Publication Data

US 2022/0051911 A1 Feb. 17, 2022

(30) Foreign Application Priority Data

Aug. 12, 2020 (TW) ................................. 109127342
Jul. 6, 2021 (TW) ................................. 110124832

(51) Int. Cl.
*H01L 21/673* (2006.01)
*H01L 21/677* (2006.01)

(52) U.S. Cl.
CPC .... *H01L 21/6732* (2013.01); *H01L 21/67379* (2013.01); *H01L 21/67383* (2013.01); *H01L 21/67386* (2013.01); *H01L 21/67781* (2013.01)

(58) Field of Classification Search
CPC .............. B65D 81/07; H01L 21/67369; H01L 21/67386; H01L 21/67379; H01L 21/67373; H01L 21/67383; H01L 21/6732
USPC ............... 206/710, 454, 711, 303; 211/41.18
See application file for complete search history.

(56) References Cited

U.S. PATENT DOCUMENTS

| 5,890,597 | A | 4/1999 | Fan et al. |
| 6,286,684 | B1 | 9/2001 | Brooks et al. |
| 6,981,594 | B1 | 1/2006 | Sarver |
| 7,578,392 | B2 | 8/2009 | Brooks et al. |
| 8,109,390 | B2 | 2/2012 | Pylant et al. |
| 2008/0230438 | A1 | 9/2008 | Shinjo et al. |
| 2008/0273959 | A1* | 11/2008 | Bunod .............. H01L 21/67383 414/801 |

(Continued)

FOREIGN PATENT DOCUMENTS

| JP | H07161805 A | 6/1995 |
| JP | H1067428 A | 3/1998 |
| JP | 2002305239 A | 10/2002 |

*Primary Examiner* — King M Chu
(74) *Attorney, Agent, or Firm* — MUNCY, GEISSLER, OLDS & LOWE, P.C.

(57) ABSTRACT

The disclosure provides an adjustable device including plates and at least two adjustable modules connect with two adjacent of the plates. The adjustable module can stretch or shrink to change a distance between plates. The disclosure also provides an adjustable storage box including an upper cover and a lower cover. A storage space is formed by the upper cover and the lower cover and for the accommodating of the adjustable device. When the upper cover moves upward relative to the lower cover, the adjustable modules changes from a compression state to a stretch state and increase a distance between plates. Whereby, it is easy to pick and place object when a distance of two adjacent plates increases. The overall volume of the adjustable device is reduced when a distance of two adjacent plates decrease, thereby saving the working space.

13 Claims, 23 Drawing Sheets

(56) References Cited

U.S. PATENT DOCUMENTS

2011/0042266 A1  2/2011  Kasama
2014/0356107 A1* 12/2014  Bonora ............. H01L 21/67383
                                                   414/808

* cited by examiner

ADJUSTABLE DEVICE AND AN ADJUSTABLE STORAGE BOX

CROSS-REFERENCE TO RELATED APPLICATION

This application claims the priority benefit of Taiwan application no. 109127342, filed 2020 Aug. 12, and Taiwan application no. 110124832, filed 2021 Jul. 6. The entirety of each of the above-mentioned patent applications is hereby incorporated by reference herein and made a part of this specification.

TECHNICAL FIELD

The disclosure relates to an adjustable device and an adjustable storage box for accommodating the adjustable device.

BACKGROUND

The storage and transfer of a wafer in semiconductor industry is very important. Because a wafer is formed by fragile material like silicon or glass, it is easy to cause damage due to improper transfer method or handling tool, then resulting in a significant increase of cost and time. In convention, for the purpose of transporting a number of wafers at one time and saving storage space, it's usually achieved in a stacking manner. However, the stored wafers are at a fixed distance so that a size of occupation of wafer storage box is large.

SUMMARY

Accordingly, the present disclosure provides an adjustable device. The adjustable device can accommodate many objects and can shrink to reduce a size of occupation. The present disclosure also provides an adjustable storage box for accommodating the adjustable device.

The present invention has been made in view of the above problems. The present disclosure provides an adjustable device including plates which are arranged vertically. At least two adjustable modules connect with two adjacent of the plates. The at least two adjustable modules stretch to adjust distance between the two adjacent of the plates.

The present invention has been made in view of the aforementioned problems. The present disclosure provides an adjustable storage box for accommodating the adjustable device. The adjustable storage box includes an upper cover, a handle arranged on the upper cover, and a lower cover disposed under the upper cover. A storage space is formed by the upper cover and the lower cover. The upper cover is connected to the upmost plate of the adjustable device. The upper cover is movably covered on the lower cover, and the lower cover is connected to the lowest plate of the adjustable device. The storage space is for accommodating the adjustable device. wherein, when the upper cover moves upward relative to the lower cover, the adjustable modules changes from a compression state to a stretch state then increase a distance between plates.

By shrink or stretch of the adjustable device, when a distance between two adjacent plates increases, it is easy to pick and place objects. The overall volume of the adjustable device is reduced when a distance of two adjacent plates decrease, thereby saving the working space.

DETAILED DESCRIPTION

Figure 1:
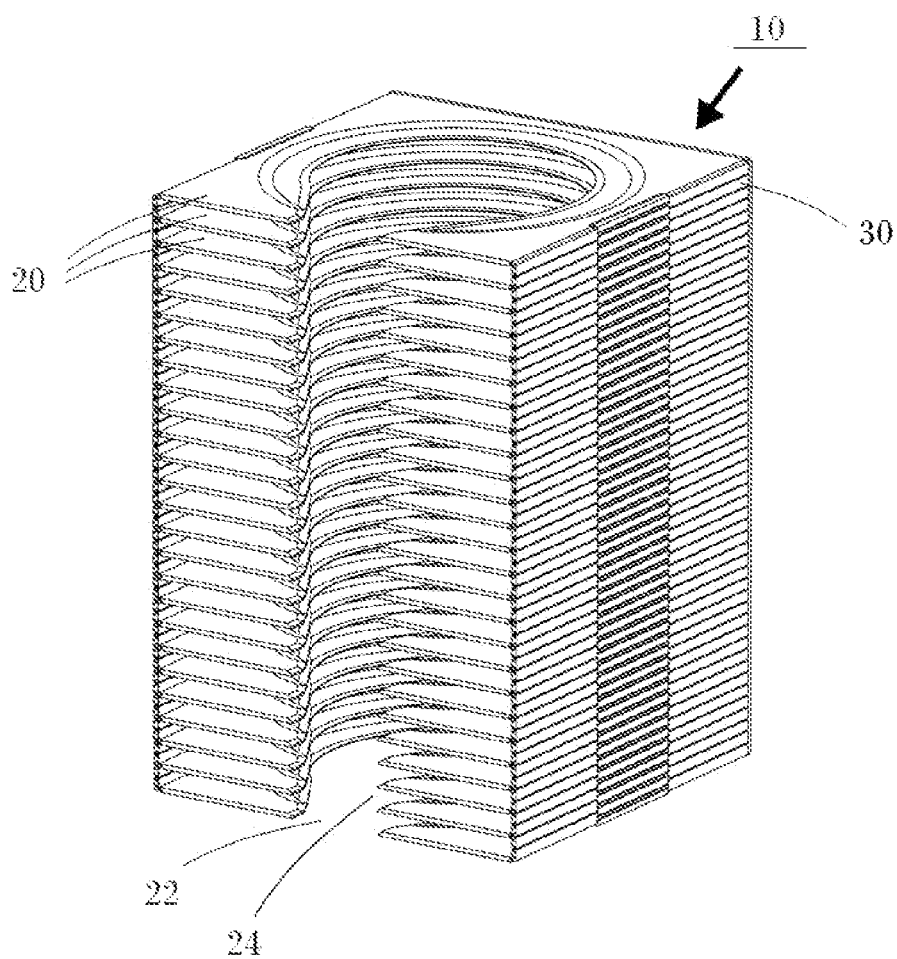
FIG. 1 is a stereograph of an adjustable device according to the first embodiment of the disclosure.

Reference will now be made in detail to the exemplary embodiments of the disclosure, examples of which are illustrated in the accompanying drawings. Wherever possible, the same reference numbers are used in the drawings and the description to refer to the same or like parts.

Some words are used to refer to specific elements in the whole specification and the appended claims in the disclosure. A person skilled in the art should understand that a wafer storage box and transfer device assembly manufacturer may use different names to refer to the same elements. The specification is not intended to distinguish elements that have the same functions but different names. In the following specification and claims, the terms "having", "including", etc. are open-ended terms, so they should be interpreted to mean "including but not limited to . . . ".

It should be noted that in the following embodiments, features in a plurality of embodiments may be replaced, recombined, or mixed to complete other embodiments without departing from the spirit of the disclosure. The features of the embodiments may be used in any combination without departing from the spirit of the disclosure or conflicting with each other.

The technical content and feature of the invention is illustrated by the following embodiment and figures. Referring to FIGS. 1, 2, 3, 4, and 5, an adjustable device 10 according to the first embodiment of the disclosure includes plates 20, and at least two adjustable module 30 which connects two adjacent plates 20. The adjustable modules 30 can stretch out or draw back to change a distance between plates 20. When the adjustable module 30 is in a stretch state, a distance between two adjacent plates 20 is the largest. When the adjustable module 30 is in a compression state, a distance between two adjacent plates 20 is the smallest. Each plate 20 can be in regular polygon shape, square, or octagon et. al. It would be noted that the shape of each plates can be modified and not be limited to the above-mentioned shapes. Each plate can accommodate an object which can be wafer, dish, or disc et. al.

Figure 2:
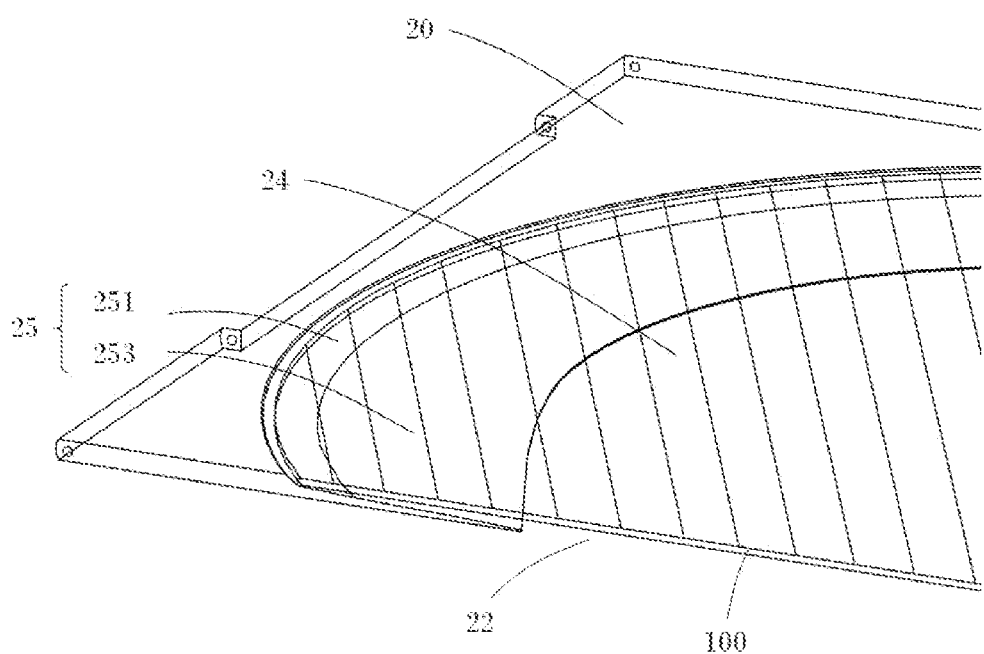
FIG. 2 and FIG. 3 are schematic views of a plate for accommodating a wafer according to the first embodiment of the disclosure.
Figure 3:
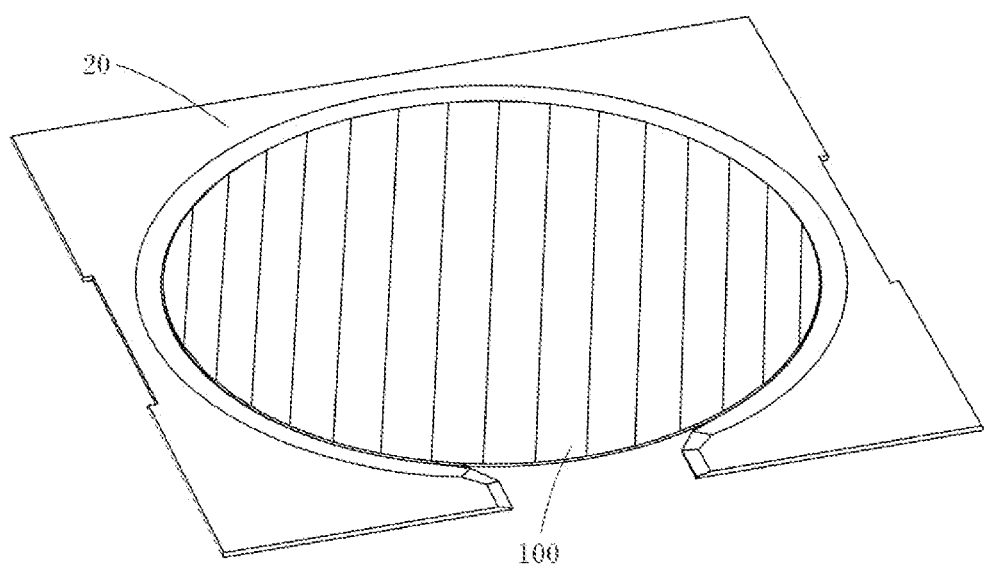

Referring to FIG. 2 and FIG. 3, the plate 20 includes a side opening 22 and a bottom opening 24. Robotic arm can place an object such as a wafer 100 on the plate 20 or pick the wafer 100 from the plate 20 via these two openings. The bottom opening 24 can be in circle shape or any other shape and can be adjusted according to the manufacturing process needs. In order to place the wafer 100 on the plate more stably, the plate 20 may include a step structure 25 which includes a step sidewall 251 and a bottom portion of the step structure 253. Each step structure 25 can limit the horizontal translation of the wafer 100, thereby ensuring the wafer 100 will not slides out or damaged during transferring or manufacturing process. An angle between the step sidewall 251 and the plate 20 is ranged from 91 to 179 degree. It would be preferred that an angle between the bottom portion of the step structure 253 and the step sidewall 251 is less than 180 degree.

When a wafer 100 is placed on the plate 20, the step structure 25 can limit the horizontal translation of the wafer 100. It is easier to pick and place the wafer 100 due to the step sidewall 251. Furthermore, an area enclosed by an outer line of the step sidewall 251 is approximately slightly larger than a projection area of the wafer 100. An outer edge of the wafer 100 is against to the step sidewall 251 but does not contact the bottom portion of the step structure 253 to avoid being damaged by the step structure 25. Besides, an area enclosed by an inner line of each bottom portion of the step structure 253 can be modified depending on a size of a wafer for convince of picking and placing the wafer 100 by a robotic arm.

Figure 4:
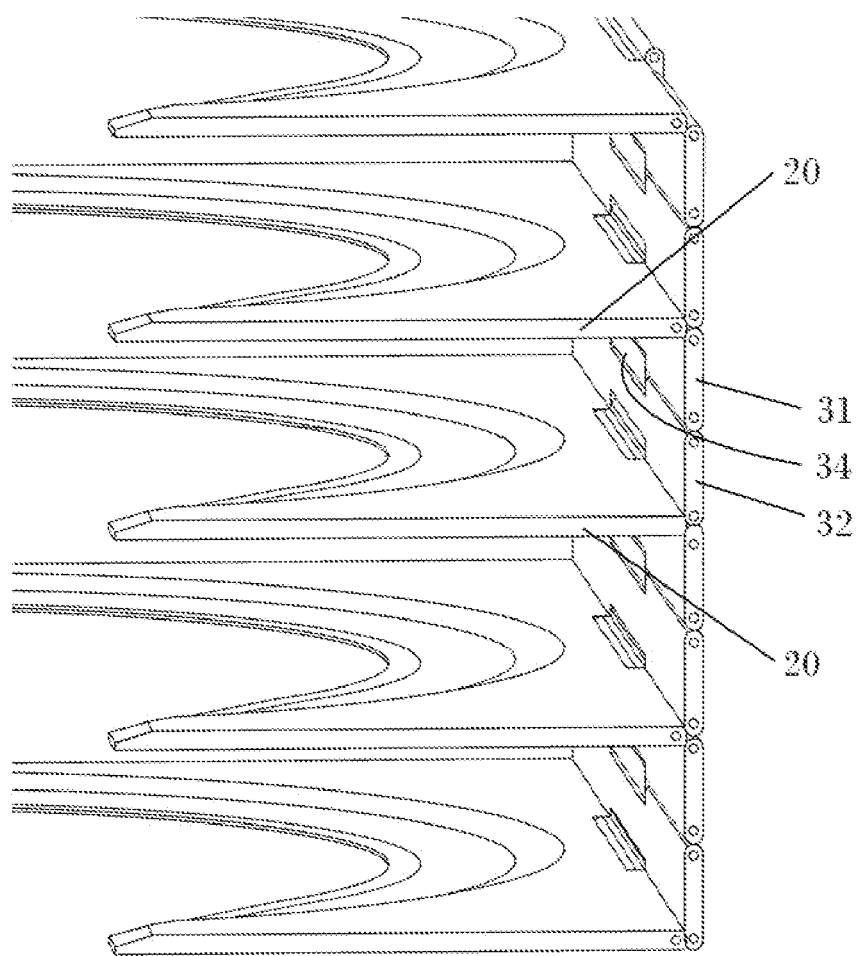
FIG. 4 and FIG. 5 are schematic views of a partial enlargement of an adjustable device according to the first embodiment of the disclosure.
Figure 5:
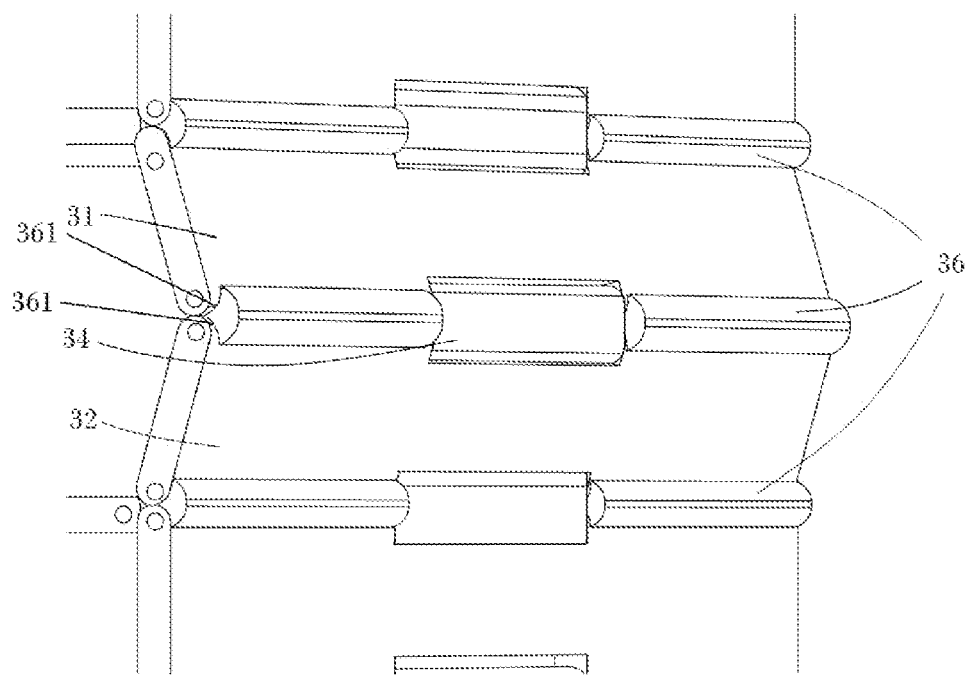
Figure 6:
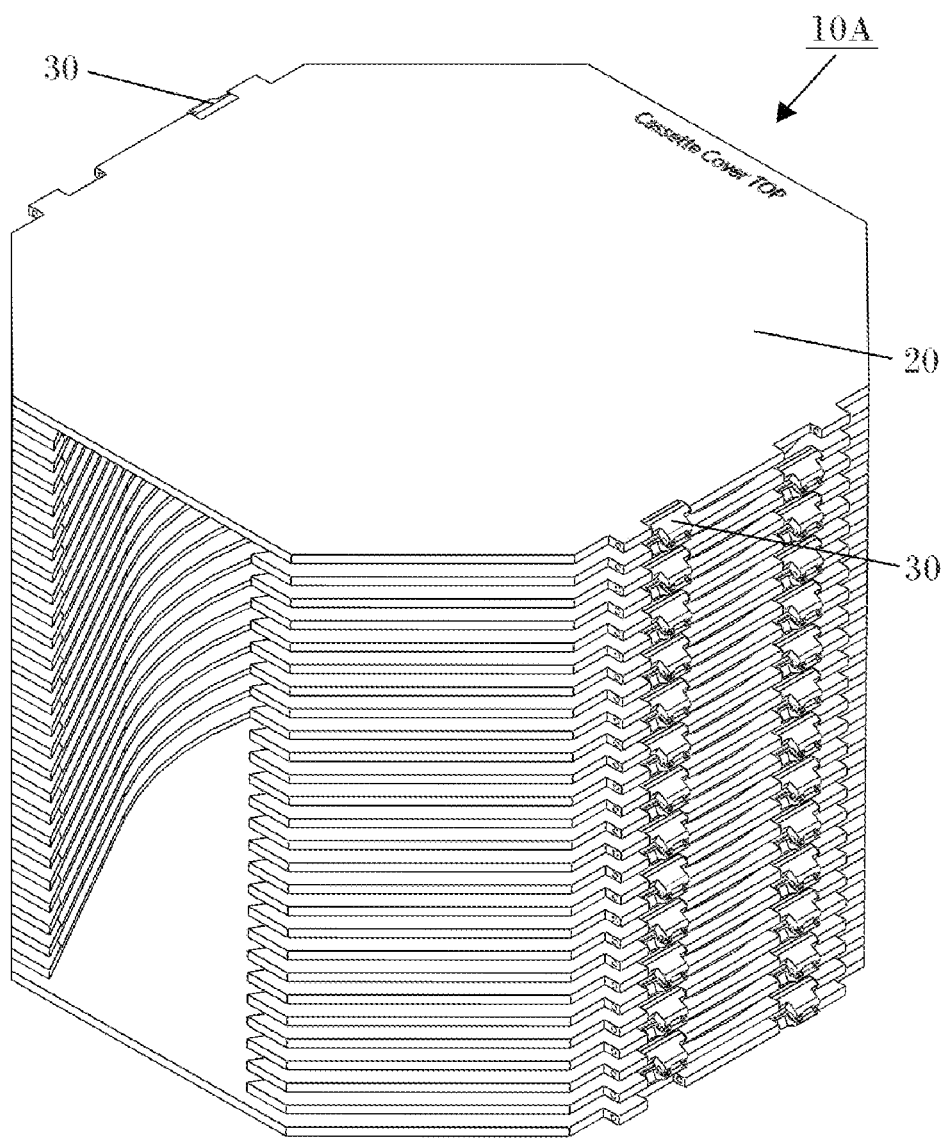
FIG. 6 is a stereograph of an adjustable device according to the second embodiment of the disclosure.

Two adjustable modules 30 are provided between each two adjacent plates 20 respectively arranged on the right and left side of the two adjacent plates 20 (as shown in FIG. 1). According to the embodiment, as shown in FIG. 4 and FIG. 5, each adjustable module 30 includes a first sidewall 31, a second sidewall 32, a connection component 34 which connects the first sidewall 31 and the second sidewall 32, and a movement restriction component 36 which is arranged on one side of the first sidewall 31 and the second sidewall 32. The first sidewall 31 is pivoted to one of the plates 20 and the second sidewall 32 is pivoted to another adjacent plate 20. When these adjustable modules are in a compression state, the first sidewall 31 and the second sidewall 32 can come close to each other. Referring to FIG. 5, the movement restriction component 36 includes two arc portions 361 which are respectively close to the first sidewall 31 and the second sidewall 32 so that the direction of stretching and drawing back of the adjustable module is limited. That is to say, the status of the adjustable module 30 changed from a stretch state to a compression state, the first sidewall 31 and the second sidewall 32 can present a convex shape like ">" (as shown in FIG. 5). In another embodiment, the movement restriction component 36 can also be arranged on the inner side of the connection component 34 or any other structural modified can be made, even can be omitted. The structure of the connection component 34 is not limited as long as the first sidewall 31 and the second sidewall 32 are connected with each other. A way to pivot first sidewall 31 and the second sidewall 32 to the plate 20 is not limited, it could be a hinge pass through plates 20, first sidewalls 31 and second sidewalls 32. In another embodiment, it could be the way that the first sidewall 31 and the second sidewall 32 respectively have plugs that plug into the pivot holes of the plates 20.

When a distance between two adjacent plates 20 increase by the stretch of the adjustable module 30, it is easy to pick and pack an object on the plate. When a distance between two adjacent plates 20 decrease, an overall volume of the adjustable device is reduced and to streamline the working space.

Figure 7:
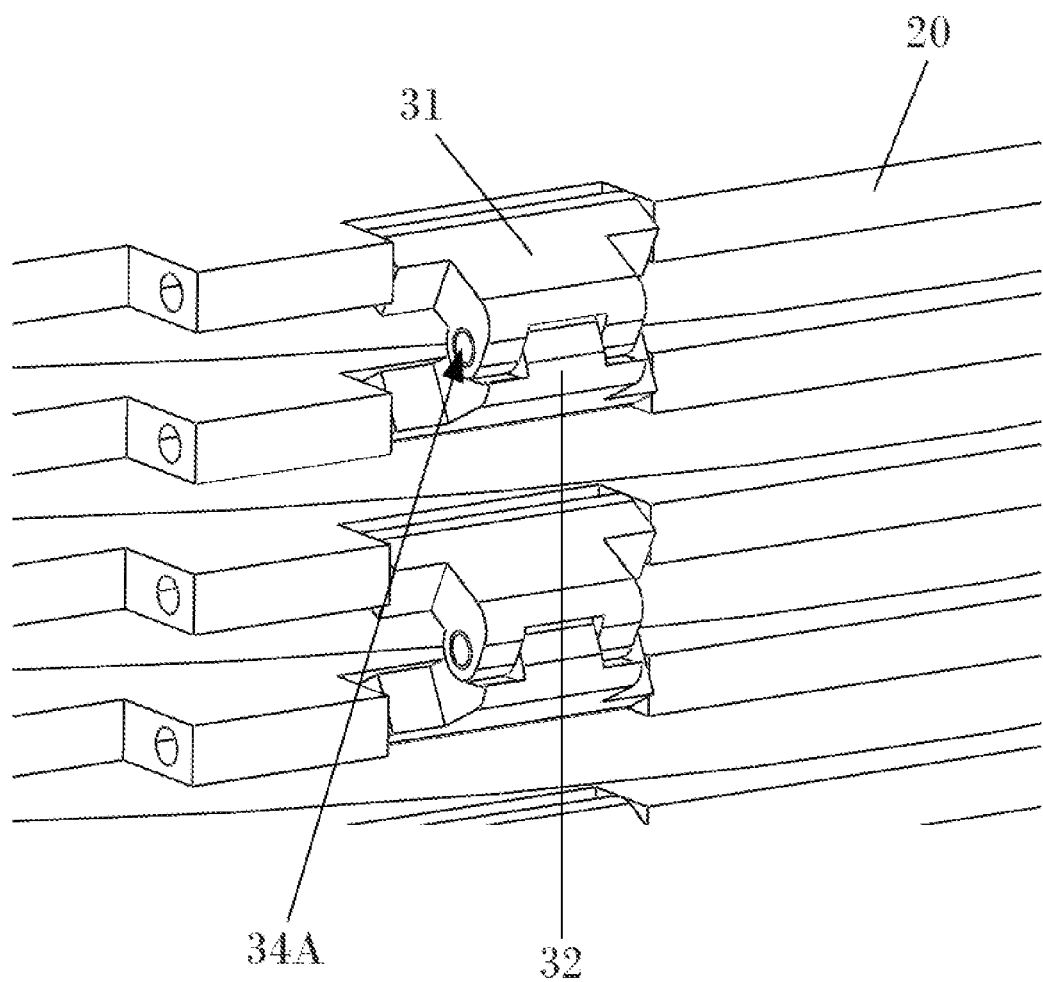
FIG. 7 is a schematic view of a partial enlargement of an adjustable device according to the second embodiment of the disclosure.
Figure 8:
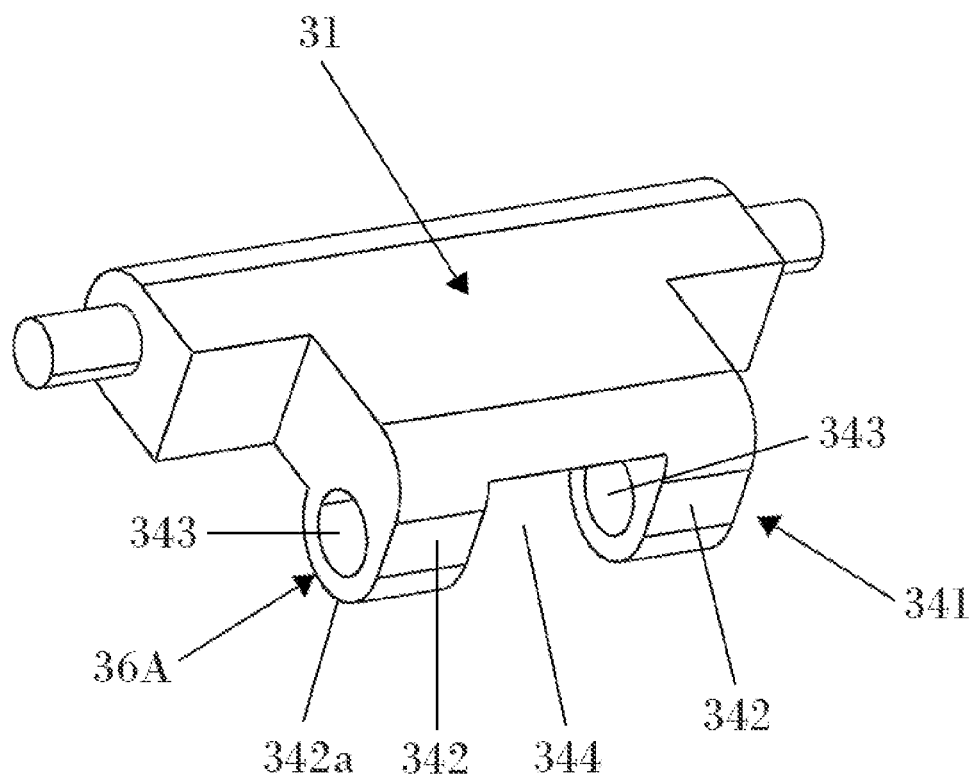
FIG. 8 and FIG. 9 are stereographs of a connecting component for sidewalls device according to the second embodiment of the disclosure.
Figure 9:
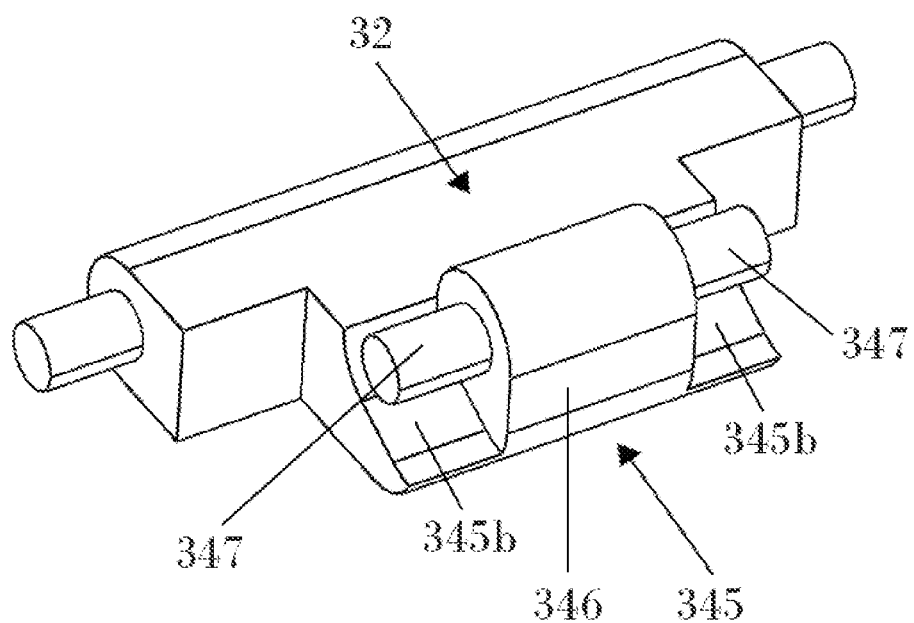

An adjustable device 10A of the second embodiment is shown in FIGS. 6, 7, 8, and 9. The structure is substantially the same as the adjustable device 10 of the first embodiment except the connection component 34A. The connection component 34A of the second embodiment includes a first connection portion 341 formed on the first sidewall 31 and a second connection portion 345 formed on the second sidewall 32. As shown in FIGS. 8 and 9, the first connection portion 341 includes two first bodies 342, two pivot holes 343 respectively formed on the first body 342. An accommodation space 344 is located between two first bodies 342. The second connection portion 345 includes a second body 346 accommodated in the accommodating space 344 and two pivot pins 347 extending from the second body 346 and plug into the two pivot holes 343. The connection component 34A can connect the first sidewall 31 and the second sidewall 32. Besides, the two first bodies 342 of the first connection portion 341 respectively have an arc portions 342a, the second connection portion 345 includes two indentations 345b respectively arranged on two sides of the second body 346. The two arc portions 342a could touch against the two indentations 345b to form a movement restriction component 36A. The movement restriction component 36A limits the stretching and drawing back of the adjustable module. That is to say, the first sidewall 31 and the second sidewall 32 can present a convex shape like ">" (as shown in FIG. 7). On the other hand, two adjustable modules 30 are arranged on two opposite sides of two adjacent plates 20. In another embodiment, the first connection portion 341 can interchange with the second connection portion 345.

Figure 10:
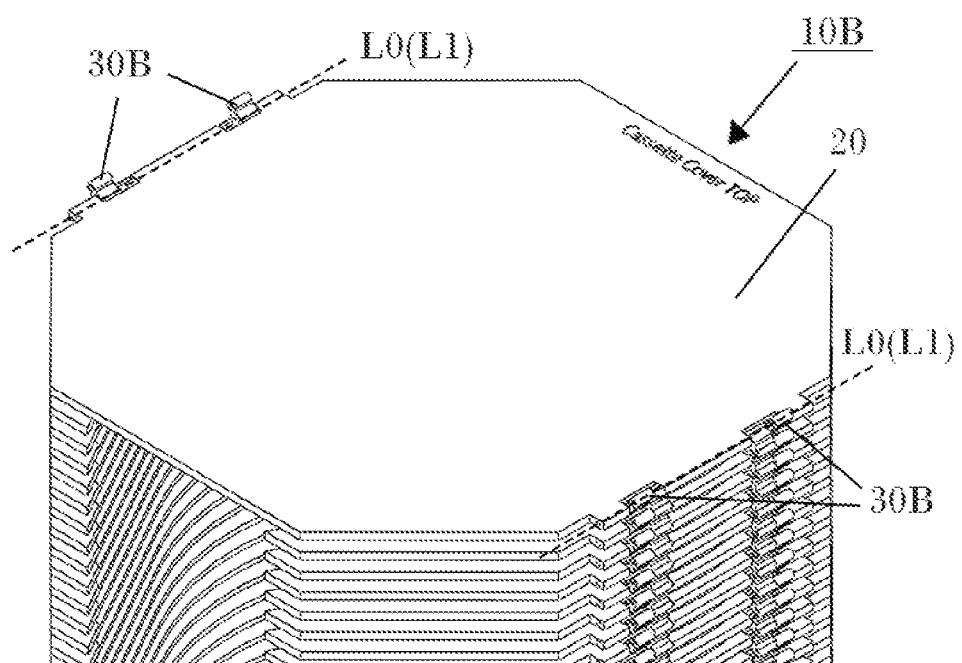
FIG. 10 is a stereograph of an adjustable device according to the third embodiment of the disclosure.
Figure 11:
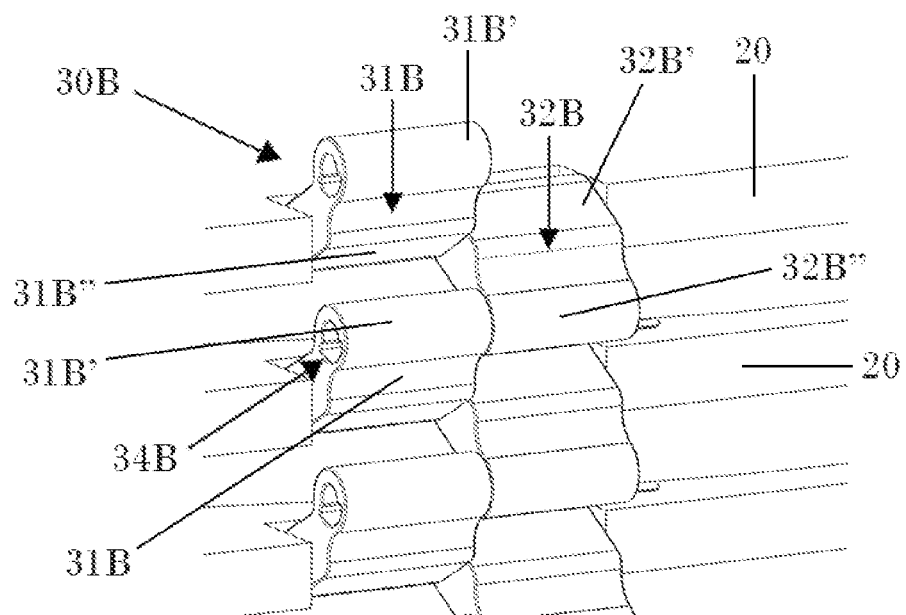
FIG. 11 is a schematic view of a partial enlargement of an adjustable device according to the third embodiment of the disclosure.
Figure 12:
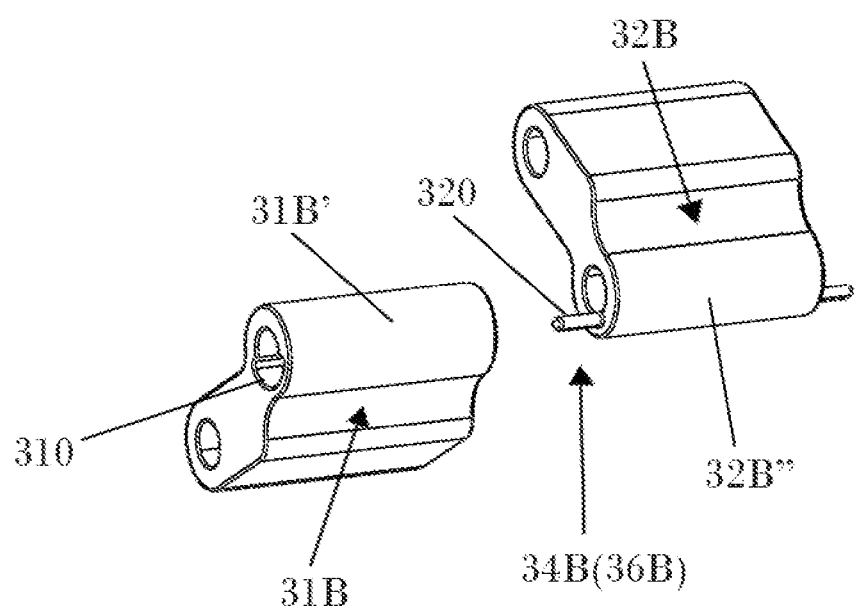
FIG. 12 is a schematic view of a breakdown illustration of a first sidewall and a second sidewall according to the third embodiment of the disclosure.
Figure 13:
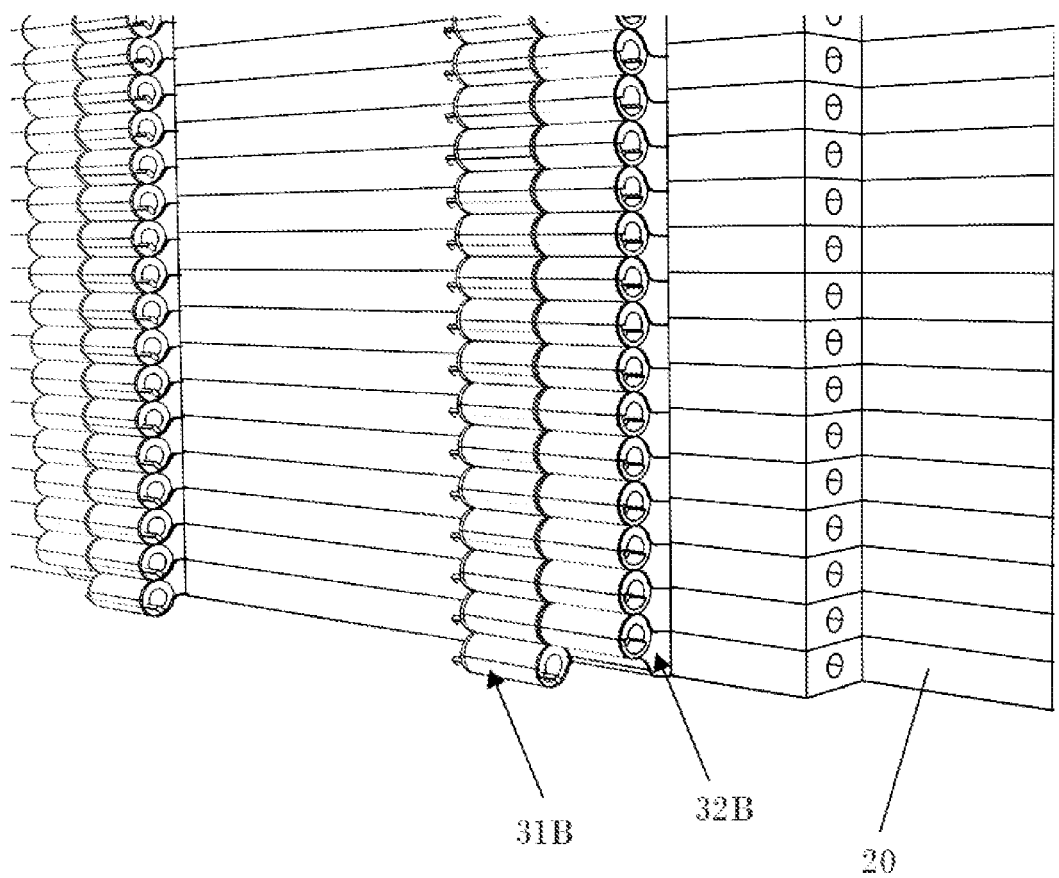
FIG. 13 is a schematic view of an adjustable module in a compression state according to the third embodiment of the disclosure.

An adjustable device 10B of the third embodiment is shown in FIGS. 10, 11, 12 and 13. The structure is substantially the same as the adjustable device 10 or 10A except adjustable modules 30B. The adjustable modules 30B of the third embodiment includes a first sidewall 31B, a second sidewall 32B which is pivoted to the first sidewall 31B on the same plate 20, and a connection component 34B that connects both the first sidewall 31B which is pivoted to another plates 20 and the second sidewall 32B. The first sidewalls 31B come close to each other when the adjustable modules 30B are in a compression state. The second sidewalls 32B come close to each other when the adjustable modules 30B are in a compression state. Referring to FIG. 11, in the embodiment, the lower portions 31B' of the first sidewalls 31B are pivoted to the upper portion 32B' of the second sidewalls 32B on the same plate 20, and the lower portion 32B" of the second sidewall 32B is pivoted to a upper portion 31B" of the first sidewall 31B which is on another plate 20. Referring to FIG. 12, the upper portion 31B' of the first sidewall 31B includes a restriction trail 310. The lower portion 32B" of the second sidewall 32B includes a restriction pin 320 which can extent into the restriction trail 310 to form a connection component 34B which connects the first sidewall 31B and the second sidewall 32B. At the same time, the restriction pin 320 is limited to only move within the restriction trail 310 so that the restriction pin 320 and the restriction trail 310 form a movement restriction component 36B to limit the stretch or drawing back of the adjustable module 30B. On the other hand, as shown in FIG. 10, each two adjacent plates 20 includes two pairs of adjustable modules which are respectively arranged on opposite sides of the plates. The first sidewall 31B and the second sidewall 32B are pivoted to the plate 20 in a pivot direction L1 which is parallel to an extension direction L0 of the plate 20.

Figure 14:
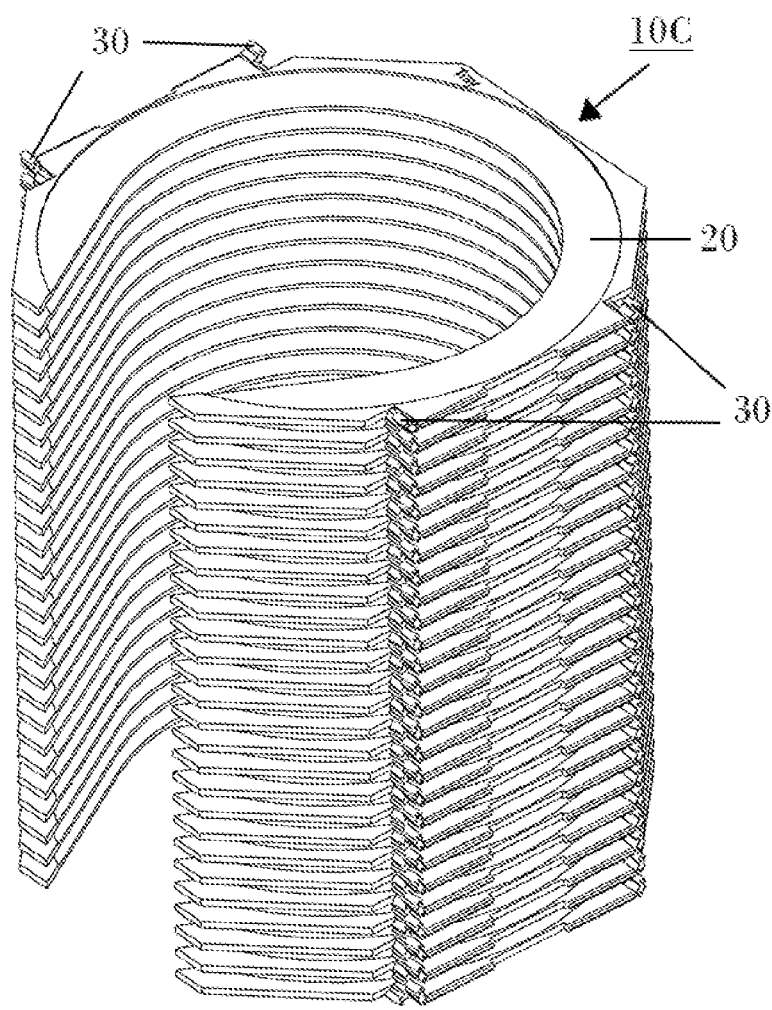
FIG. 14 is a stereograph of an adjustable device according to the fourth embodiment of the disclosure.
Figure 15:
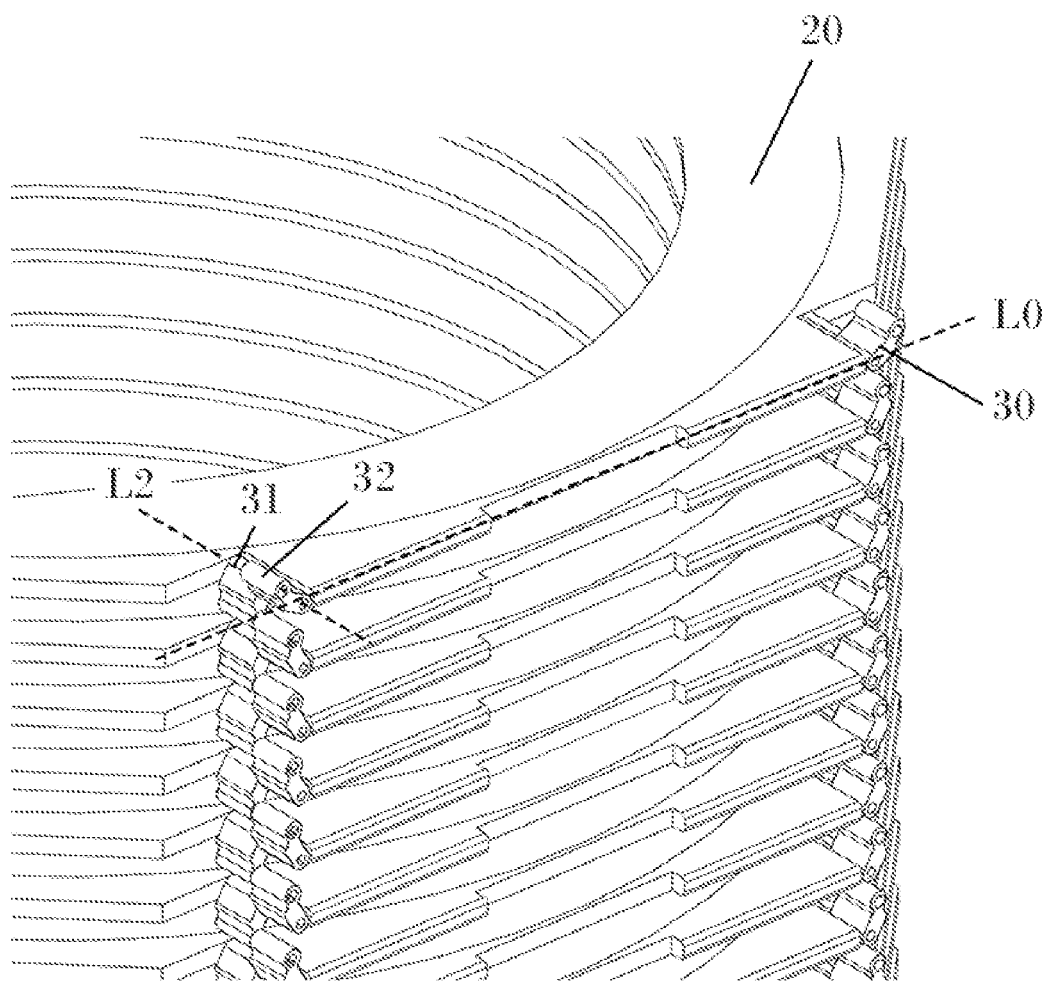
FIG. 15 is a schematic view of a particle enlargement of an adjustable device according to the fourth embodiment of the disclosure.

An adjustable device 10C of the fourth embodiment of the disclosure is shown in FIG. 14 and FIG. 15. The structure is substantially the same as the adjustable device 10B except the adjustable module 30 on two sides of the plate 20. The first sidewall 31B and the second sidewall 32B are pivoted to the plate 20 in a pivot direction L2 which is perpendicular to an extension direction L0 of the plate 20.

Figure 16:
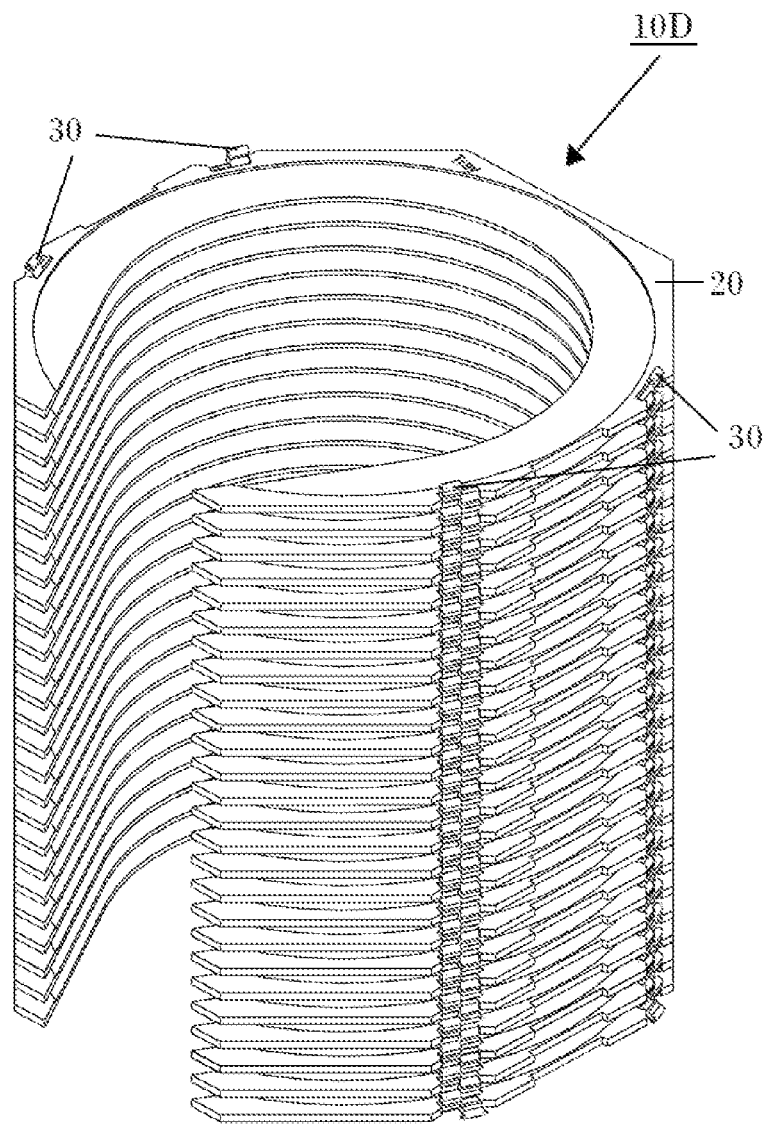
FIG. 16 is a stereograph of an adjustable device according to the fifth embodiment of the disclosure.
Figure 17:
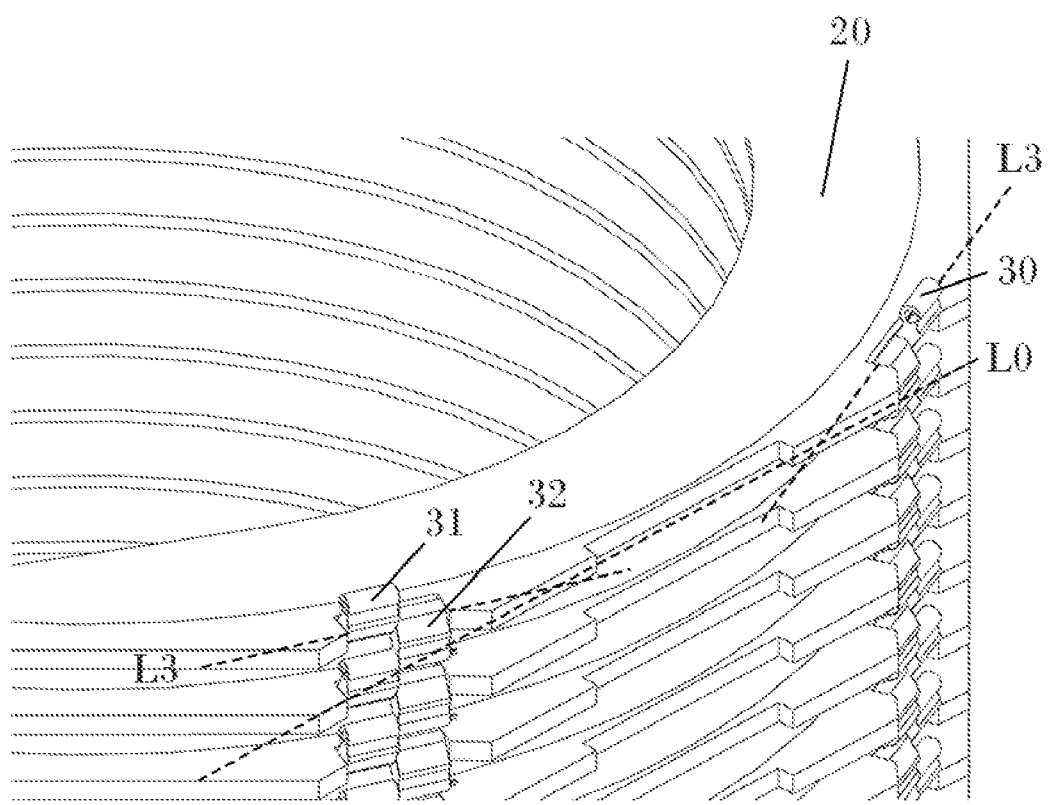
FIG. 17 is a schematic view of a particle enlargement of an adjustable device according to the fifth embodiment of the disclosure.

An adjustable device 10D of the fourth embodiment of the disclosure is shown in FIG. 16 and FIG. 17. The structure is substantially the same as the adjustable device 10C except the adjustable module 30 on two sides of the plate 20. The first sidewall 31B and the second sidewall 32B are pivoted to the plate 20 in a pivot direction L3 which is neither perpendicular nor parallel to an extension direction L0 of the plate 20.

Figure 18:
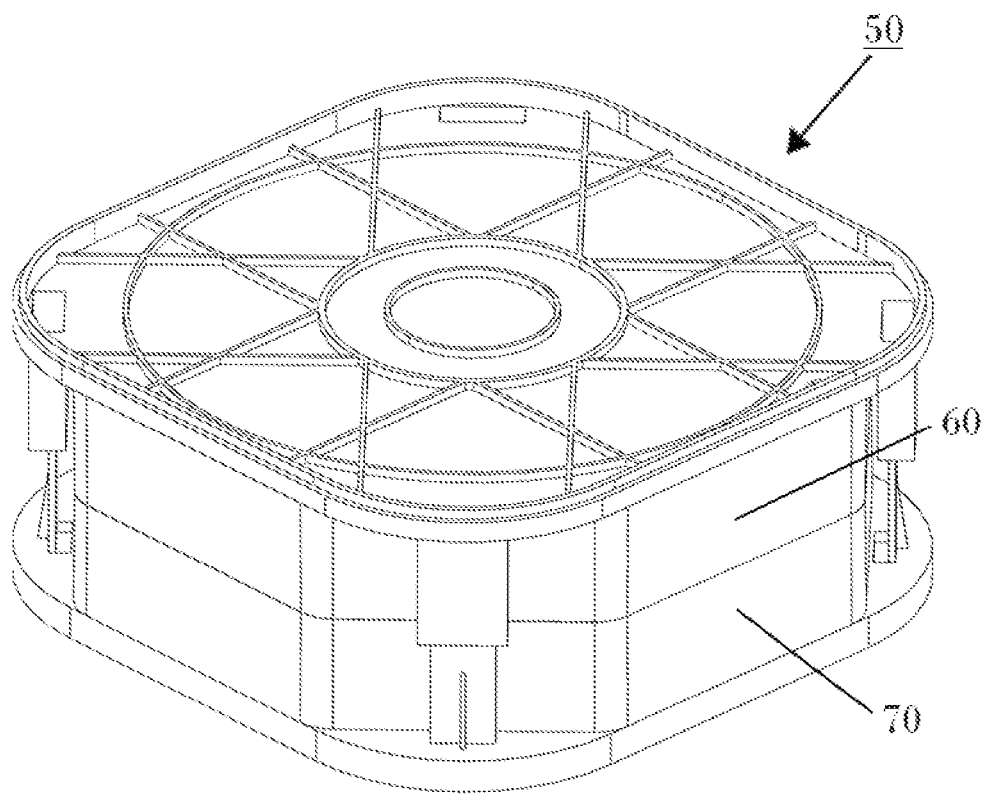
FIG. 18 is a schematic view of an adjustable storage box when the adjustable module in a compression state according to the disclosure.
Figure 19:
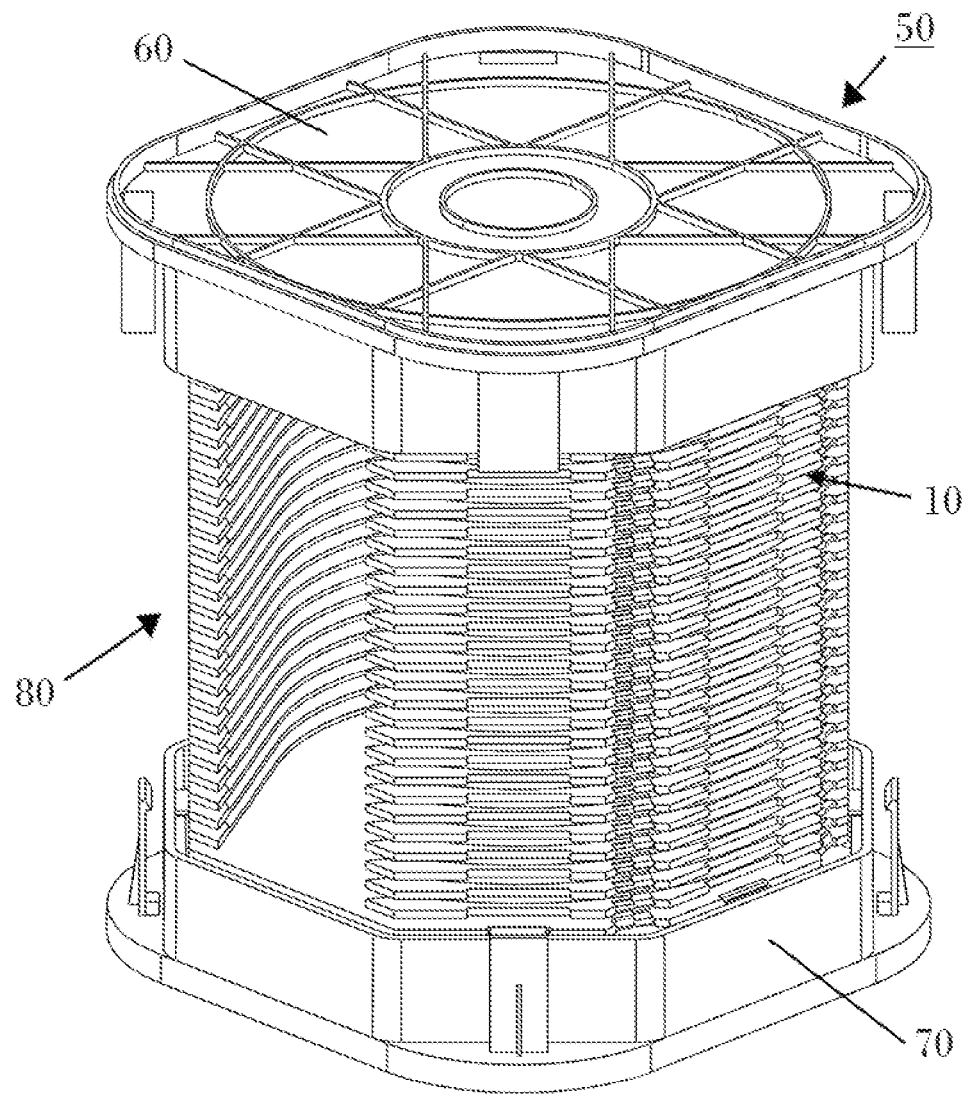
FIG. 19 is a schematic view of an adjustable storage box when the adjustable module in a stretch state according to the disclosure.

Referring to FIG. 18 and FIG. 19, the disclosure provides an adjustable storage box 50 for accommodating the above-mentioned adjustable devices 10, 10 A, 10 B, 10C and 10 D (collectively referred to as 10). The adjustable storage box 50 includes an upper cover 60, a lower cover 70 disposed under the upper cover 60, and a storage space 80 disposed between the upper cover 60 and the lower cover 70. The upper cover 60 can moves up and down to cover the lower cover 70. The storage space 80 accommodates the adjustable device 10. FIG. 18 shows the state of the adjustable storage box 50 when the adjustable module 30 is in a compressed state, that is, the upper cover 60 is covered on the lower cover 70, FIG. 19 shows the state of the adjustable storage box 50 when the adjustable module 30 is in a stretch state when the upper cover 60 is separated from the lower cover 70. The shapes of the upper cover 60 and lower cover 70 can be modified according on the shape of the plate 20. Even the upper cover 60 can be plate-shaped. Besides, there could be a handle on the upper cover 60 of the adjustable storage box 50 for manually or mechanically picking or placing the upper cover 60.

Figure 20:
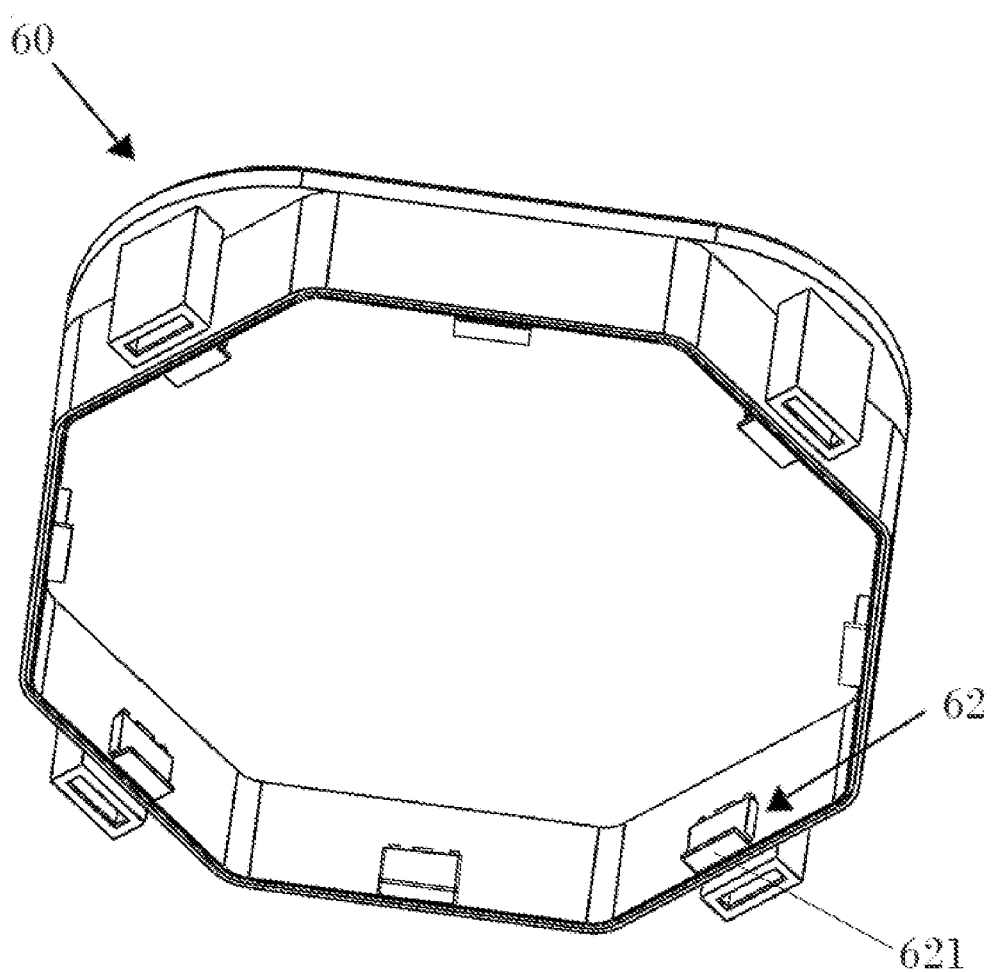
FIG. 20 is a stereograph of an upper cover of an adjustable storage box of the disclosure.
Figure 21:
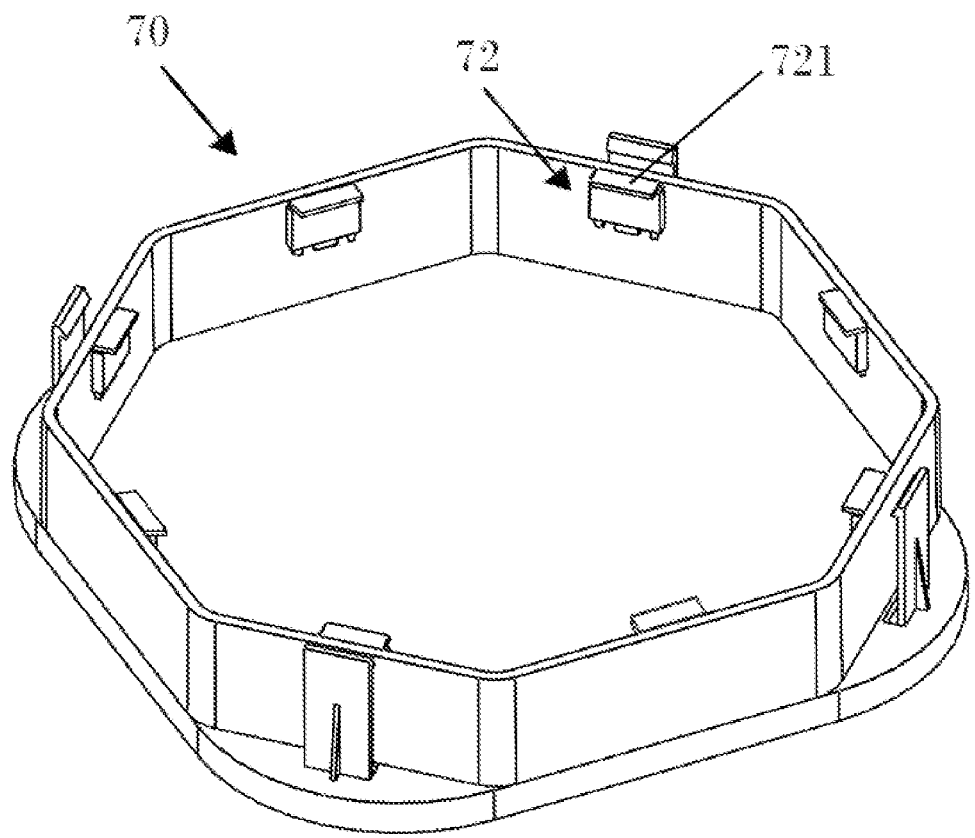
FIG. 21 is a stereograph of a lower cover of an adjustable storage box of the disclosure.

The upper cover 60 can be connected to the upmost plate 20 of the adjustable device 10 and the lower cover 70 can be connected to the lowest plate 20 of the adjustable device 10. Referring to FIG. 20 and FIG. 21, the upper cover 60 includes eight upper position restriction components 62 which are respectively arranged on the eight inner sides of the upper cover 60. The lower cover 70 also includes eight lower position restriction components 72 which are respectively arranged on the eight inner sides of the lower cover 70. The upper position restriction components 62 can directly or indirectly be connected to the upmost plate 20 of the adjustable device 10, the lower position restriction components 72 can directly or indirectly be connected to the lowest plate 20 of the adjustable device 10. According to the embodiment, the upper position restriction components 62 has an upper limited block 621 which could be directly hooked on the upmost plate 20, the lower position restriction components 72 has a lower limited block 721 which could be directly hooked on the lowest plate 20. In another embodiment, the amount of these upper position restriction components 62 and these lower position restriction components 72 can be more or less. The structure of these upper position restriction components 62 and these lower position restriction components 72 will not be limited to the above embodiment as long as these upper position restriction components 62 and these lower position restriction components 72 can respectively connected to the upper cover 60 and the lower cover 70.

Figure 22:
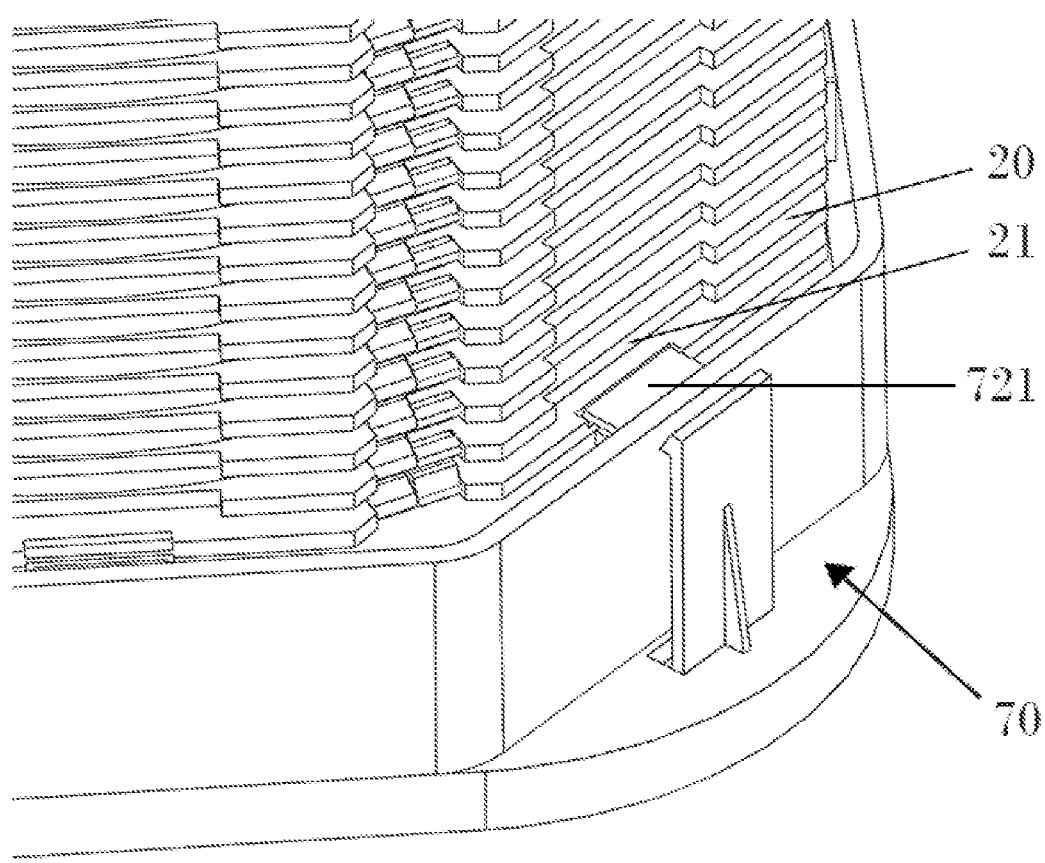
FIG. 22 is a schematic view of a lower cover directly connected to the lowest plate of the disclosure.

As shown in FIG. 22, The plates 20 have side ports 21 for the passing of the lower limited block 721 of lower position restriction components 72 except the upmost plate 20 and lowest plate 20. When the upper cover 60 moves upward relative to the lower cover 70, the upper limited block 621 of the upper position restriction component 62 of the upper cover 60 can directly spur the upmost plate 20 so that the status of adjustable module 30 of the adjustable device 10 could be changed from a compression state to a stretch state. Therefore, the plates 20 move upward and increase the distance between each plate 20. The lower position restriction components 72 can pass through the side ports 21 until the lowest plate 20 is stopped by the lower limited block 721 of the lower position restriction component 72 of the lower cover 70. At this time, the adjustable module 30 is in a stretch state and the distance between two adjacent plates 20 reach a maximum so that it is easy to pick and place an object on the plate 20. When the upper cover 60 move downward relative to the upper cover 70, the upper cover 60 is close to the upmost plate 20, the plates 20 move down and decrease the distance between each plate 20. When the adjustable module 30 is in a compression state, a distance between two adjacent plates 20 reaches a minimum. At this time, overall volume of the adjustable device 10 is reduced, thereby saving the working space.

The above-mentioned object can be picked or placed manually or mechanically without specific restriction. Besides, the upper cover 60 can be moved up and down by holding the handle or directly picking the upper cover 60. The upmost plate 20 and the lowest plate 20 may not carry objects depending on the situation.

Figure 23:
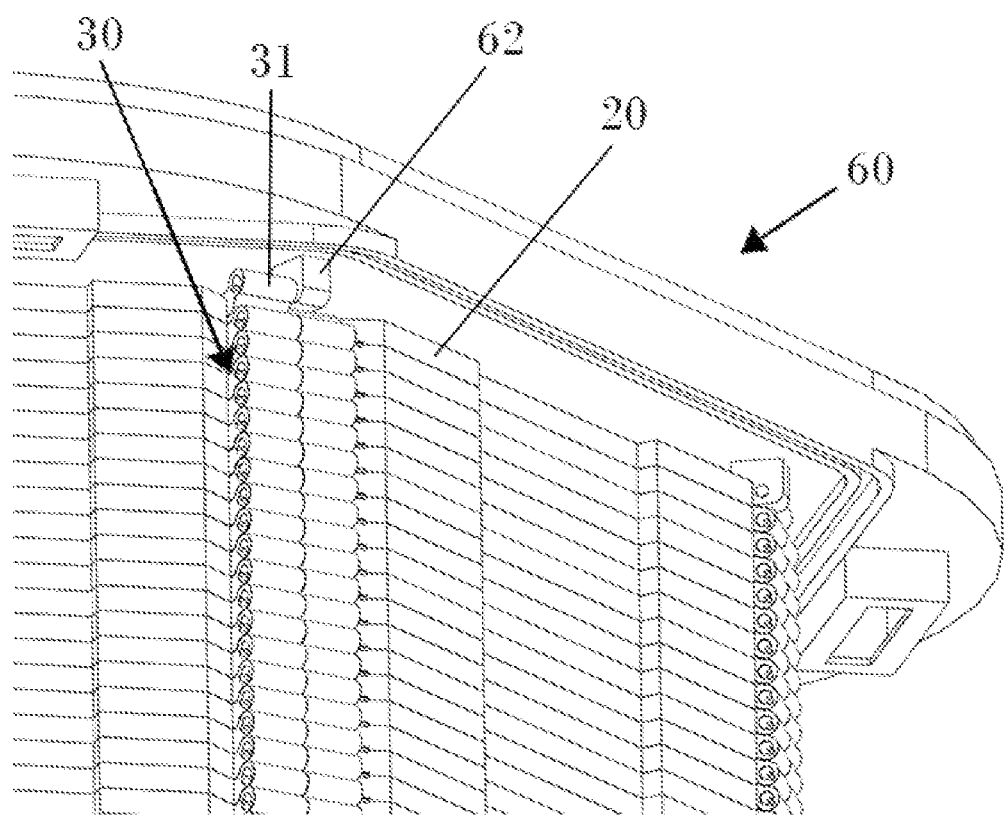
FIG. 23 is a schematic view of an upper cover directly connected to the upmost plate of the disclosure

The way that the upmost plate 20 of an adjustable device 10 indirectly connected to the upper position restriction component 62 is shown in FIG. 23. That is, the upper position restriction component 62 is pivoted to the first sidewall 31 of the adjustable module 30. When the upper cover 60 moves up and spurs the first sidewall 31, the adjustable module 30 stretches. In the same way, the lowest plate 20 of an adjustable device 10 is indirectly connected to the lowest position restriction component 72. That is, the lower position restriction component 72 is pivoted to the second sidewall 32 of the adjustable module 30. In another embodiment, the upper position restriction component 62 can be pivoted to the second sidewall 32, the lower position restriction component 72 can be pivoted to the first sidewall 31.

Although the disclosure has been described in detail with reference to the foregoing embodiments, a person of ordinary skill in the art should understand that modifications may still be made to the technical solutions in the foregoing embodiments, or equivalent replacements may be made to part or all of the technical features; and these modifications or replacements will not cause the essence of corresponding technical solutions to depart from the scope of the technical solutions in the embodiments of the disclosure.

The invention claimed is:

1. An adjustable storage device, comprising:
    plates, being arranged vertically; and
    at least two adjustable modules, connecting with two adjacent plates, wherein each of the at least two adjustable modules comprises a first sidewall to be pivoted to at least one of the plates, a second sidewall to be pivoted to at least another one of the plates, and a movement restriction component which is arranged on one side of the first sidewall and the second sidewall;
    wherein the movement restriction component confines movement directions of each of the adjustable modules, and the at least two adjustable modules stretch to adjust distance between the two adjacent plates, and wherein the first sidewall and the second sidewall come close to each other when the at least two adjustable modules are compressed.

2. The adjustable storage device of claim 1, wherein the sidewall connection component comprises a first connection portion which is arranged in the first sidewall and a second connection portion which is arranged in the second sidewall, wherein the first connection portion comprises two first bodies, two pivot holes which is respectively formed on the two first bodies, and an accommodation space which is located between the two first bodies, and wherein the second connection portion comprises a second body which is accommodated in the accommodation space, and two pivot pins respectively extend out from the second body and into the two pivot holes.

3. The adjustable storage device of claim 2, wherein each of the two first bodies comprises an arc portion, wherein the second connection portion further comprises two indentations which are respectively on two sides of the second body, wherein the two arc portions respectively contact the two indentations to form a movement restriction component, and the movement restriction component confines movement directions of each of the adjustable modules.

4. An adjustable storage device, comprising:
    plates, being arranged vertically; and
    at least two adjustable modules, connecting with two adjacent plates; wherein the adjustable modules comprises a first sidewall, a second sidewall which is pivoted to the first sidewall on the same plate, and a sidewall connection component connects the first sidewall which is pivoted to another plates and the second sidewall, and wherein when the at least two adjustable modules is compressed, the first sidewalls come close to each other and the second sidewalls come close to each other.

5. The adjustable storage device of claim 4, wherein a lower portion of the first sidewall of a plate is connected to an upper portion of the second sidewall on the same plate and a lower portion of the second sidewall of the plate is connected to an upper portion of the first sidewall on another plate.

6. The adjustable storage device of claim 5, wherein the upper portion of the first sidewall comprises a restriction trail, the lower portion of the second sidewall comprises a restriction pin, and the restriction pin extends into the restriction trail to form a movement restriction component.

7. The adjustable storage device of claim 5, wherein the upper portion of the first sidewall comprises a restriction trail, the lower portion of the second sidewall comprises a restriction pin, and the restriction pin extends into the restriction trail to forms the sidewall connection component.

8. The adjustable storage device of claim 4, wherein the plates are in regular polygon shape and the adjustable modules are respectively located on two sides of the plates.

9. The adjustable storage device of claim 8, wherein one of both the first sidewall and the second sidewall of the adjustable modules are pivoted in a direction which is perpendicular to an extension direction of the side of the plate.

10. The adjustable storage device of claim 8, wherein one of both the first sidewall and the second sidewall of the adjustable modules are pivoted in a direction which is not perpendicular to an extension direction of the side of the plate.

11. An adjustable storage box for accommodating the adjustable device of claim 1, comprising:
    an upper cover, being connected to the upmost plates of the adjustable device;
    a lower cover, being disposed under the upper cover, wherein the upper cover covers the lower cover movably and the lower cover is connected to the lowest plate of the adjustable device; and
    a storage space, being formed by the upper cover and the lower cover and for accommodating of the adjustable device;
    wherein, when the upper cover moves upward relative to the lower cover, the adjustable modules changes from compression state to stretch state and increase a distance between plates.

12. The adjustable storage box of claim 11, wherein the upper cover comprises at least one upper position restriction component, wherein the lower cover comprises at least one lower position restriction component, wherein the upper position restriction component can be directly or indirectly connected to the upmost plate, and wherein the lower position restriction component can be directly or indirectly connected to the lowest plate.

13. The adjustable storage box of claim 12, wherein at least one of the plates of the adjustable device comprises a side port for passing of the lower position restriction component.

* * * * *